(12) United States Patent
Matsumoto et al.

(10) Patent No.: US 6,720,900 B2
(45) Date of Patent: Apr. 13, 2004

(54) GUESS METHOD AND APPARATUS, SAMPLING APPARATUS

(75) Inventors: Takuya Matsumoto, Hyogo (JP); Kazuyuki Yagi, Hyogo (JP)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/299,227

(22) Filed: Nov. 19, 2002

(65) Prior Publication Data

US 2003/0095058 A1 May 22, 2003

(30) Foreign Application Priority Data

Nov. 21, 2001 (JP) ........................................ 2001-356098

(51) Int. Cl.$^7$ ............................................... H03M 1/12
(52) U.S. Cl. ........................................ 341/155; 341/123
(58) Field of Search ............................. 341/155, 123, 341/124, 132

(56) References Cited

U.S. PATENT DOCUMENTS 6,493,657 B1 * 12/2002 Godfrey et al. ............. 702/198

OTHER PUBLICATIONS

Article entitled, "Agilent Technologies Impedance Measurement Handbook," 2$^{nd}$ edition.

* cited by examiner

*Primary Examiner*—Brian Young
*Assistant Examiner*—Joseph J Lauture

(57) ABSTRACT

A sampling apparatus including two or more samplers, where a signal is sampled simultaneously by each sampler and the values sampled by one of the samplers is then used. In this way, sampling operations for the purpose of ranging are eliminated, and the time required for ranging can be shortened. Moreover, the possibility that the instantaneous values of the signal input to the sampler will exceed the input range of the sampler can be inferred in each sampler by establishing a suitable threshold value for its sample values.

9 Claims, 6 Drawing Sheets

GUESS METHOD AND APPARATUS, SAMPLING APPARATUS

BACKGROUND OF THE INVENTION

1. Field of the Invention

The present invention generally relates to a sampling apparatus which samples analog signals and digitizes and outputs them; in particular, it concerns a sampling apparatus with a plurality of input ranges.

2. Discussion of the Background Art

Analog/digital converters (referred to below as "ADC") are often used in the signal receiving parts of electronic measuring apparatuses. Since sampled signals can have high dynamic ranges, it is beneficial that the whole amplitude of the signal input to the ADC is close to the full scale input value of the ADC. Sampling apparatuses may be constructed in electronic measuring apparatuses by placing an amplifier before the ADC. In this instance, the whole amplitude of the signal input to the ADC is amplified so that it is close to the full scale input value of the ADC.

FIG. 1 shows a conventional sampling apparatus which is provided with an amplifier and has a plurality of input ranges. In FIG. 1, the sampling apparatus 100 is provided with an input terminal 110, a switch 120, an amplifier 130, and ADC 140, and an output terminal 150.

The amplifier 130 is placed between the input terminal 110 and the switch 120 and amplifies the amplitude of the signal input from the input terminal 110, and outputs it to the switch 120.

The switch 120 connects the input terminal 110, the amplifier 130, and the ADC 140; it selectively connects either the input terminal 110 or the amplifier 130 to the ADC 140.

The ADC 140 samples the input signal and converts the analog signal values to digital data, which are output to output terminal 150.

The sampling apparatus 100, which is constructed as described above has 2 input ranges. That is, the signal that is input into the input terminal 110 is either sampled directly or after being amplified. Here, the setting at which the signal input to the input terminal 110 is directly sampled is called the "low-gain range," and the setting at which this input signal is amplified before sampling is called the "high-gain range."

When a signal with a large amplitude is sampled in the high-gain range in such a sampling apparatus 100 with 2 input ranges, the instantaneous values of the signal sometimes exceed the input range of the ADC 140 and values cannot be sampled effectively. Therefore, in a sampling apparatus 100 which has a plurality of input ranges, an operation of switching to a suitable range for sampling is necessary. This operation is generally called "ranging."

An example of a means generally used in ranging with the sampling apparatus 100 shown in FIG. 1 is as follows. First, the range is switched to the low-gain range. Then, sampling is performed by the ADC 140. The sampling is performed for 1 cycle of the signal input to the sampling apparatus 100. If the input signal is a symmetrical wave, such as a sine wave signal, half of a cycle is enough. Next, a value which exceeds the input range of the ADC 140 when the sampling is performed in the high-gain range is taken as a threshold value; all of the sample values are compared with this threshold value, and if all of the sample values are below the threshold value, the switch is thrown to the high-gain range and regular sampling is performed. If at least 1 sample value is at or above the threshold value, regular sampling is performed with the setting still at the low-gain range.

Thus, in conventional ranging means, it is necessary to input at least one-half of a period into the sampling apparatus to perform the sampling for ranging. This time becomes longer the longer the period of the input signal is. In some cases switching is performed, so that time is also required for the over-responses of the signal caused by the switching to converge. These times become part of the measurement time of the electronic measuring apparatus, and are factors which limit the degree to which the measurements can be accelerated.

Since measurement times are factors which are reflected in manufacturing costs, etc., it is desirable to shorten measurement times, and it is desirable to shorten the times required for ranging and sampling in sampling apparatuses.

The present invention uniquely eliminates the sampling operation performed for ranging and shortens the time required for ranging by sampling signals simultaneously by a number of sampling means in a sampling apparatus provided with two (2) or more sampling means and uses the values sampled by one of these sampling means. Moreover, the present invention unexpectedly infers the possibility that an instantaneous value of a signal input into a sampling means will exceed the input range of the sampling means by establishing a suitable threshold for the values of the samples obtained by this sampling means.

SUMMARY OF THE INVENTION

A sampling apparatus comprising at least two (2) sampling means and a selection means for selecting the sampling means which uses the sampled values of the sampling means selected by the selection means as its output. The sampling means sample the same sine wave signal which has a known frequency at N (3 or more) points per cycle. The selection means selects the sampling means with the narrowest input range among the sampling means such that the absolute values of the samples of the sine wave signal are all below a threshold value. The threshold value is sin $(\pi/2-\pi/N)$ times one-half the input range of the sampling means when N is even, and sin $[\pi/2-\pi/(2N)]$ times one-half the input range of the sampling means when N is odd.

An apparatus is provided herein with a sampling means and a comparison means which makes inferences concerning the possibility that an instantaneous value of a single wave signal will exceed the input range of the sampling means by sampling the sine wave signal by the sampling means and comparing the sampling values by means of the sampling means. The sampling means samples a sine wave signal which has a known frequency at N (3 or more) points per cycle. The comparison means is a means which compares the absolute values of the aforementioned samples with a threshold value which is set at sin $(\pi/2-\pi/N)$ times one-half the input range of the sampling means when N is even, and sin $[\pi/2-\pi/(2N)]$ times one-half the input range of the sampling means when N is odd. If the absolute value of at least one (1) sample is at or above the threshold, this apparatus infers the possibility that an instantaneous value of the aforementioned sine wave signal will exceed the input range of the sampling means.

DETAILED DESCRIPTION OF THE INVENTION

Figure 1:
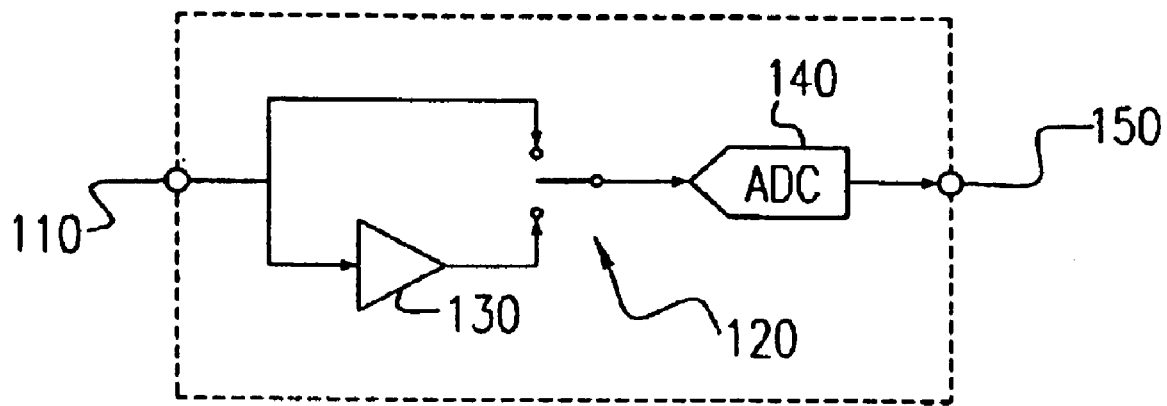
FIG. 1 is a drawing showing a sampling apparatus of the prior art.
Figure 2:
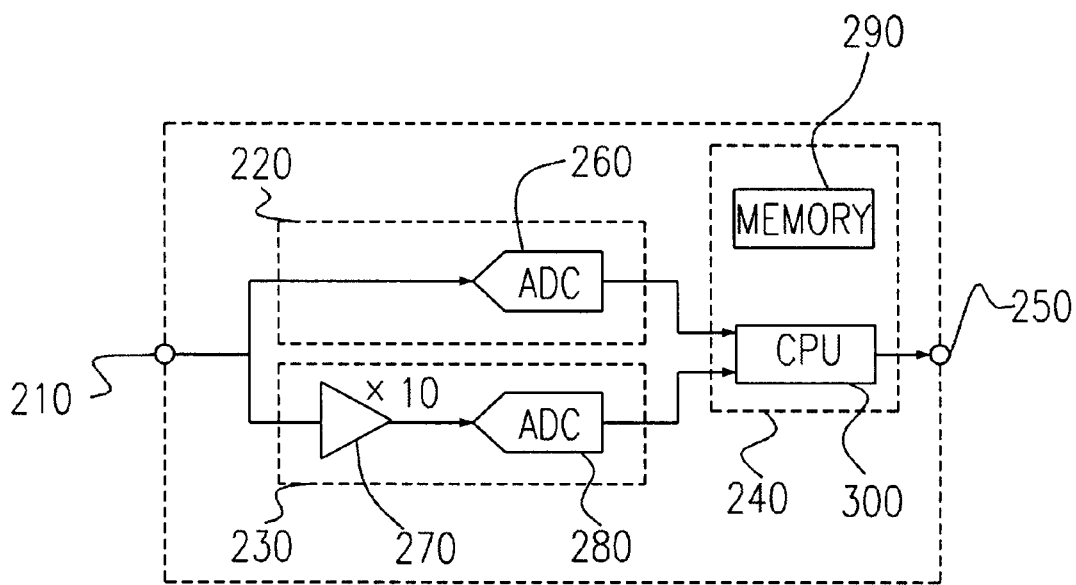
FIG. 2 is a drawing showing a working example of the present invention.

The present invention will be explained below on the basis of a working example shown in the appended drawings. This working example is a receiver of a network analyzer which uses the apparatus of this invention, a block diagram of it is shown in FIG. 2. In what follows, the expression "receiver of a network analyzer" will be abbreviated to "receiver." The receiver 200, which is an example of a sampling apparatus, is provided with an input terminal 210; samplers 220 and 230, which are examples of sampling means; a selection apparatus 240, which is an example of a selection means; and an output terminal 250. The signal input to the input terminal 210 is sampled, the sample values are converted to digital data, and this data are output to the output terminal 250.

The input terminal 210 is connected to the inputs of the samplers 220 and 230. A sine wave signal with a known frequency is input to the input terminal 210.

The sampler 220 is provided with an ADC 260 that samples the input sine wave signal at four (4) points per cycle and converts the sample values to digital data that are output to the selection apparatus 240. The input range of the ADC 260 is from −1 to +1, therefore the input range of the sampler 220 is also from −1 to +1.

The sampler 230 is provided with an amplifier 270 (which has an amplification ratio of 10) and an ADC 280. The input sine wave signal is amplified by the amplifier 270 and then sampled at four (4) points per cycle. These sample values are converted to digital data that are output to the selection apparatus 240. Furthermore, since the input range of the ADC 280 is from −1 to +1, the input range of the sampler 230 is from −0.1 to +0.1.

The selection apparatus 240 is provided with a memory 290 that stores the digital data produced by the samplers 220 and 230 and a CPU 300. Selection apparatus 240 outputs the digital data produced by either sampler 220 or 230 to the output terminal 250. The output terminal 250 is connected to the selection apparatus 240, and outputs the digital data output from the selection apparatus 240.

In the selection apparatus 240, the CPU 300 is connected to the samplers 220 and 230, the memory 290, and the output terminal 250. CPU 300 receives the digital data series from the samplers and successively writes it to the memory 290.

Moreover, CPU 300 refers to the digital data series written to the memory 290 and selects one or the other sampler 220, 230 by a comparison calculation; the digital data produced by the selected sampler are output to the output terminal 250.

The criteria by which the CPU 300 selects a sampler are that the sine wave signal be sampled without distortion, and that the dynamic range is as large as possible. That is, the sampler with the narrowest input range, among the samplers which are such that the instantaneous values of the sine wave signal input from the input terminal 210 do not exceed their input ranges, is selected.

Figure 3:
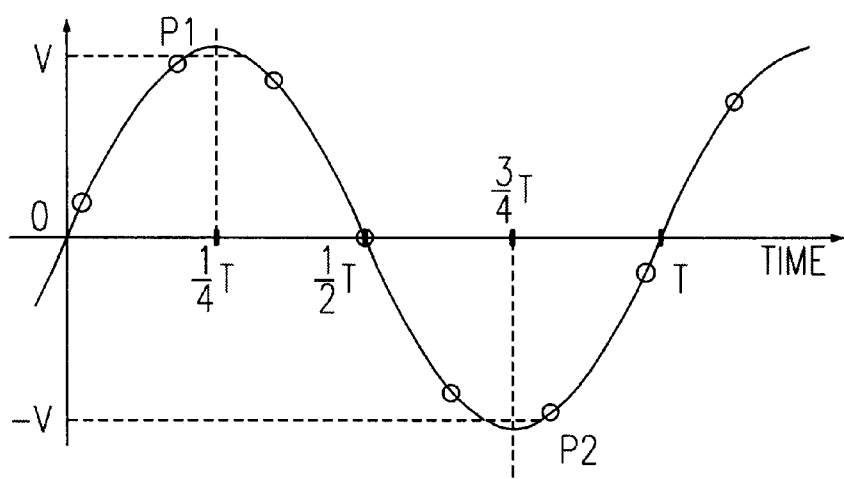
FIG. 3 is a drawing showing an example of sampling a sine wave signal.

As mentioned above, the CPU 300 selects the sampler by referring only to the digital data series which the various samplers have produced. Since the samplers sample the sine wave signal according to a specific period, the instantaneous values of the sine wave signal, when the sampling is performed, do not always exceed the input ranges of the samplers. An example is shown in FIG. 3, which shows a sine wave signal and samples of it. In FIG. 3, V is the maximum value of the input range of the sampler. As can be seen clearly from FIG. 3, the samples P1 and P2 are at positions slightly off from the peak value of the sine wave signal, and their values do not exceed the input range of the sampler.

However, the instantaneous value of the sine wave signal between these samples does exceed the input range of the sampler. Thus, a suitable sampler cannot be selected simply from the sample values, that is, from the digital data series produced by each sampler. Therefore, it is necessary to select the sampler by inferring whether the instantaneous values of the sine wave signal input to each sampler will or will not exceed the input range of that sampler.

This inference is performed as follows: when a sine wave signal with a total amplitude equal to the total amplitude is sampled, and when the signal is sampled in such a way that the value of the sample which is closest to the amplitude of the sine wave signal is the smallest, the absolute value of that sample is taken as the threshold value. Moreover, if the absolute value of at least one (1) sample is at or above this threshold value, it is inferred that there is a possibility that an instantaneous value of the sine wave signal will exceed the input range of the sampler. Conversely, if this absolute value is below the threshold value, it is inferred that the instantaneous values of the sine wave signal will not exceed the input range of the sampler.

Figure 4:
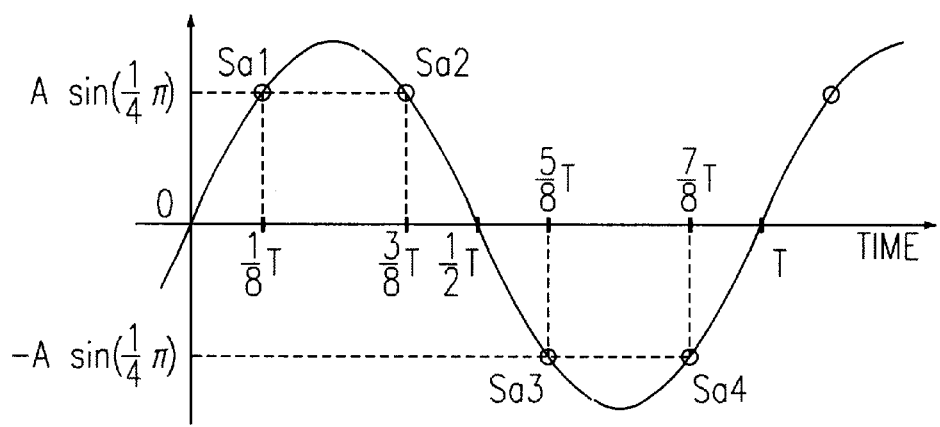
FIG. 4 is a drawing showing an example in which a sine wave signal is sampled at 4 points per cycle.

In the receiver 200 of this working example, the threshold value is determined as follows. FIG. 4 shows an example of a sine wave signal and examples of the samples Sa1, Sa2, Sa3, and Sa4 sampled at four (4) points in one (1) period of this signal. In FIG. 4, the sine wave signal has an amplitude A, this is equal to one-half of the input range of the sampler. The samples are sampled at T/8, 3T/8, 5T/8, and 7T/8, where T is the period of the sine wave signal. When the sampling is performed in this way, the absolute values of the samples become the smallest for the sample with an absolute value which is closest to the amplitude of the sine wave signal, compared with samplings performed with other timings.

Furthermore, the absolute value of the sample is $A \sin(\pi/4)$. This value is taken as the threshold for selecting the sampler.

The receiver 200, constructed as described above, performs the sampling according to the following procedure.

Figure 5:
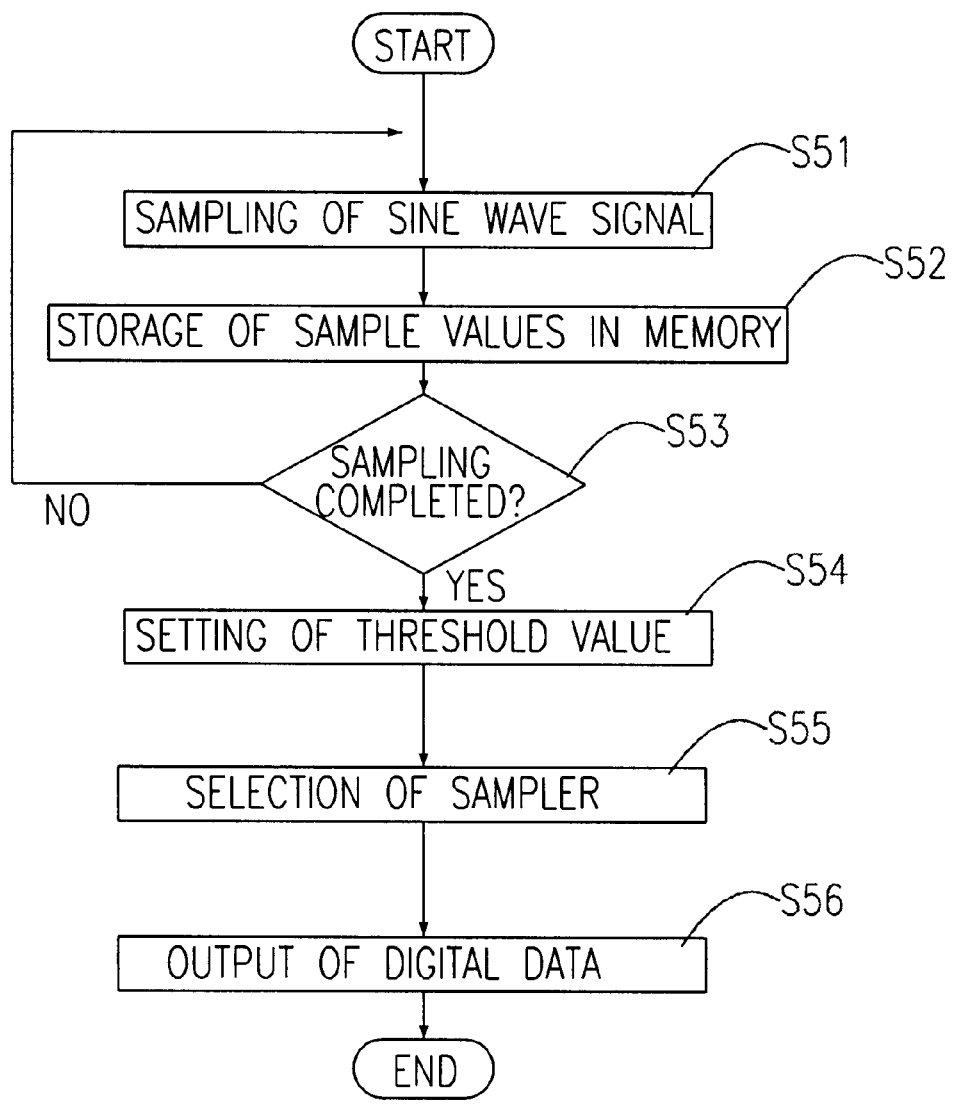
FIG. 5 is a drawing showing the procedure for sampling of a sampling apparatus in accordance with the present invention.

Referring to FIG. 5, Step S51, the sine wave input into each sampler is sampled simultaneously.

In Step S52, the CPU 300 writes the values sampled by each sampler to memory.

In Step S53, the flow returns to Step S51 and the sampling is repeated until the number of samples needed for the measurement are obtained. When the number of samples needed for the measurement are obtained, the processing proceeds to Step S54.

In Step S54, the threshold value is determined for each sampler.

In Step S55, the CPU 300 refers to the digital data series written to the memory and, for each digital data series, compares the absolute values of the samples with the aforementioned threshold value and picks out the digital data series for which the absolute values of the samples are below the aforementioned threshold value. Among the samplers corresponding to the digital data series picked out, it selects the sampler with the narrowest input range.

For example, if a sine wave signal with an amplitude of 0.3 is input into the input terminal, the sample values of the sampler 230 sometimes exceed the threshold value. On the other hand, since all of the sample values of the sampler 220 are below the threshold value, the sampler 220 is selected.

Moreover, if a sine wave with an amplitude of 0.07 is input into the input terminal, all of the sample values of the samplers 220 and 230 are below the threshold value; therefore, the sampler 230, which has a narrower input range than the sampler 220, is selected.

Finally, in Step S56, the digital data produced by the selected sampler are output to the output terminal.

As explained above, the receiver 200 samples the input sine wave signal simultaneously with all of the samplers and then selects the sampler which samples this sine wave signal with no distortion and with the highest dynamic range possible. This selection operation corresponds to the ranging of the prior art. Furthermore, the digital data series produced by the selected sampler is output to the output terminal 250. Since the sampling operation for the purpose of ranging which was needed in the prior art is eliminated in this way, the time required for ranging is shortened. Of course, a new comparison calculation operation for the purpose of selecting the sampler is produced, but since the principal CPUs have extremely good calculation performances, this calculation time is extremely short, compared with the time needed for sampling in the prior art.

Furthermore, in order to select the sampler, only samples from one (1) period of the input signal are needed. Moreover, if the signal is a sine wave signal which oscillates symmetrically with respect to the center of the input range of the sampler, only samples from half the period of the signal are needed.

Moreover, the sampling frequency in this working example exceeds the Nyquist frequency, but the effectiveness of this invention is exhibited in the same manner even if under-sampling is performed.

In this working example, since the threshold is $A \sin(\pi/4)$, a margin of approximately 30% of half of the signal amplitude is established. In order to make this margin smaller, the number of samples per period may be increased.

Figure 6:
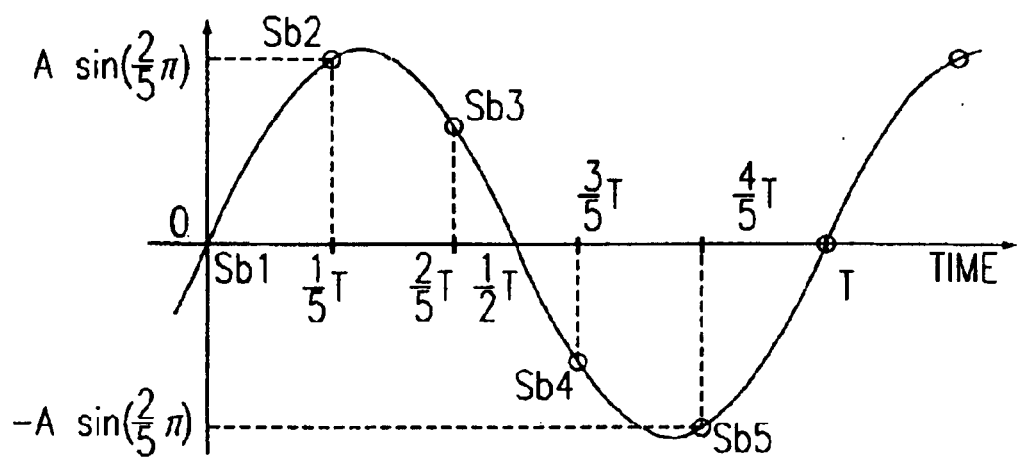
FIG. 6 is a drawing showing an example in which a sine wave signal is sampled at 5 points per cycle.

For example, if the sine wave signal is sampled at 5 points per period by the samplers 220 and 230, the threshold for selecting the sampler is determined as follows. FIG. 6 shows a sine wave signal and the samples Sb1, Sb2, Sb3, Sb4, and Sb5 obtained when it is sampled a 5 points per period. In FIG. 6, the sine wave signal has an amplitude of A, which is equal to half of the input range of the sampler. The samples are taken at 0, T/5, 2T/5, 3T/5, and 4T/5, where T is one period of the sine wave signal. If the sampling is performed in this manner, the absolute value of the sample is the smallest for the sample which is closest to the amplitude of the sine wave signal compared with samplings performed with other timings. Furthermore, the absolute value of this sample is $A \sin(2\pi/5)$. This value is the threshold value for selecting the sampler. Therefore, the margin is reduced to about 5%.

Furthermore, when a sampler samples a sine wave signal at N points per period, the threshold value, when N is even, $$\text{threshold value} = A \sin((\pi/2)-(\pi/N)) \quad \text{[Eq. 1]}$$

and, when N is odd, $$\text{threshold value} = A \sin((\pi/2)-(\pi/2N)) \quad \text{[Eq. 2]}$$

Here, A is half the input range of the aforementioned sampler.

As explained in detail above, since this invention is constructed and operates in the manner described above, in a sampling apparatus provided with 2 or more sampling means, the signal is sampled simultaneously by each sampling means and the values sampled by one of these sampling means are then used. In this way, sampling-operations for the purpose of ranging are eliminated, and the time required for ranging can be shortened.

Moreover, in each sampling means, by establishing a suitable threshold value for its sample values, the possibility that the instantaneous values of the signal input to the sampling means will exceed the input range of the sampling means can be inferred.

What is claimed is:

1. An apparatus comprising:

at least two samplers; and a selection apparatus for selecting one of said at least two samplers; wherein said at least two samplers sample a sine wave signal having a known frequency at N points per cycle; said selection apparatus selects said one of said at least two samplers having a narrower input range such that absolute values of said sine wave signal samples are all below a threshold value; and said threshold value is $\sin(\pi/2-\pi/N)$ times one-half the input range of said samplers when N is even, and $\sin[\pi/2-\pi/(2N)]$ times one-half an input range of said samplers when N is odd.

2. An apparatus in accordance with claim 1, wherein N equals 3 or more.

3. An apparatus in accordance with claim 1, wherein said samplers includes an analog/digital converter.

4. An apparatus comprising:

a sampler for sampling a sine wave signal; and a comparator that makes inferences concerning a possibility that an instantaneous value of a sine wave signal sampled by said sampler will exceed an input range of said sampler by comparing sampling values of said sampled sine wave signal; wherein said sampler samples said sine wave signal of a known frequency at N points per cycle; said comparator compares absolute values of said sine wave signal samples with a threshold value which is set at $\sin(\pi/2-\pi/N)$ times one-half the input range of said sampler when N is even, and $\sin[T\pi/2-\pi/(2N)]$ times one-half the input range of said sampler when N is odd; and in the instance the absolute value of at least one sample is at or above said threshold, this apparatus infers the possibility that an instantaneous value of said sine wave signal will exceed the input range of said sampler.

5. An apparatus in accordance with claim 4, wherein N equals 3 or more.

6. An apparatus in accordance with claim 4, wherein said samplers includes an analog/digital converter.

7. A method for sampling a sine wave signal by a sampler for obtaining sampling values and inferring, from the sampling values, a possibility that an instantaneous value of the sine wave signal will exceed an input range of said sampler, the method comprising:

sampling a sine wave signal having a known frequency at N points per cycle;

setting a threshold value at $\sin(\pi/2-\pi/N)$ times one-half the input range of said sampler when N is even, and $\sin[\pi/2-\pi/(2N)]$ times one-half the input range of said sampler when N is odd; and comparing absolute values of said sampling values with said threshold value, and in the instance an absolute value of at least one sampling value is at or above said threshold, the possibility that an instantaneous value of said sine wave signal will exceed the input range of said sampler is inferred.

8. The method in accordance with claim 7, wherein N equals 3 or more.

9. The method in accordance with claim 7, wherein said samplers includes an analog/digital converter.

* * * * *